(12) United States Patent
Lu et al.

(10) Patent No.: US 9,230,864 B1
(45) Date of Patent: Jan. 5, 2016

(54) METHOD OF FORMING A SEMICONDUCTOR DEVICE HAVING A METAL GATE

(71) Applicant: UNITED MICROELECTRONICS CORP., Hsin-Chu (TW)

(72) Inventors: Chia-Lin Lu, Taouyuan County (TW); Chun-Lung Chen, Tainan (TW); Kun-Yuan Liao, Hsin-Chu (TW); Feng-Yi Chang, Tainan (TW); Shi-Xiong Lin, Yilan County (TW)

(73) Assignee: UNITED MICROELECTRONICS CORP., Science-Based Industrial Park, Hsin-Chu (CN)

( * ) Notice: Subject to any disclaimer, the term of this patent is extended or adjusted under 35 U.S.C. 154(b) by 0 days.

(21) Appl. No.: 14/515,534

(22) Filed: Oct. 16, 2014

(51) Int. Cl.
*H01L 21/8238* (2006.01)
*H01L 21/8234* (2006.01)
*H01L 21/28* (2006.01)
*H01L 29/78* (2006.01)

(52) U.S. Cl.
CPC .... *H01L 21/82345* (2013.01); *H01L 21/28088* (2013.01); *H01L 21/28114* (2013.01); *H01L 21/823462* (2013.01); *H01L 21/823842* (2013.01); *H01L 29/7831* (2013.01)

(58) Field of Classification Search
CPC .................. H01L 21/28026; H01L 29/66007
See application file for complete search history.

(56) References Cited

U.S. PATENT DOCUMENTS

| 6,504,210 B1 * | 1/2003 | Divakaruni et al. ......... 257/344 |
| 8,669,618 B2 | 3/2014 | Fu et al. |
| 8,704,294 B2 | 4/2014 | Liao et al. |
| 2012/0264285 A1 | 10/2012 | Rachmady et al. |
| 2012/0313178 A1 * | 12/2012 | Liao et al. ..................... 257/368 |
| 2013/0099307 A1 * | 4/2013 | Tseng et al. .................. 257/330 |

* cited by examiner

*Primary Examiner* — Cheung Lee
(74) *Attorney, Agent, or Firm* — Winston Hsu; Scott Margo

(57) ABSTRACT

A method of forming a semiconductor device having a metal gate includes the following steps. First of all, a first gate trench is formed in a dielectric layer. Next, a first work function layer is formed, covering the first gate trench. Then, a protection layer is formed in the first gate trench, also on the first work function layer. Then, a patterned sacrificial mask layer is formed in the first gate trench to expose a portion of the protection layer. After that, the exposed protection layer is removed, to form a U-shaped protection layer in the first gate trench. As following, a portion of the first work function layer under the exposed protection layer is removed, to form a U-shaped first work function layer in the first gate trench. Finally, the patterned sacrificial mask layer and the U-shaped protection layer are completely removed.

11 Claims, 7 Drawing Sheets

METHOD OF FORMING A SEMICONDUCTOR DEVICE HAVING A METAL GATE

BACKGROUND OF THE INVENTION

1. Field of the Invention

The present invention relates to a method of forming a semiconductor device having a metal gate, and more particularly to a method of forming a semiconductor device which can prevent against work function layer damage.

2. Description of the Prior Art

Poly-silicon is conventionally used as a gate electrode in semiconductor devices, such as metal-oxide-semiconductors (MOS). However, with a trend toward scaling down the size of the semiconductor device, work function metals are used to replace the conventional polysilicon gate to be the control electrode that cooperates with the high-K gate dielectric layer. The conventional dual metal gate methods are categorized into gate first process and gate last process. Among the two main processes, the gate last process is able to avoid processes of high thermal budget and to provide wider material choices for the high-K gate dielectric layer and the metal gate, and thus gradually replaces the gate first process.

In a conventional gate-last process, after a dummy gate is formed, the dummy gate is removed to form a trench where a work function layer and a metal gate layer are sequentially filled therein to form a metal gate structure. Due to the shrinkage of the device size as a consequence of device miniaturization, it is increasingly difficult to fill the materials into the trench. In some cases, overhang structure and void may occur, thereby decreasing the quality of the metal gate.

SUMMARY OF THE INVENTION

It is one of the primary objectives of the present invention to provide a method of forming a semiconductor device having metal gate, in which a protection layer is formed to protect the work function layer, so as to keep the aforementioned issues from affecting the work function performances and the quality of the device.

To achieve the purpose described above, the present invention provides a method of forming a semiconductor device having a metal gate comprising following steps. First of all, a first gate trench is formed in a dielectric layer. Next, a first work function layer is formed, covering in the first gate trench. Then, a protection layer is formed in the first gate trench, also on the first work function layer. Then, a patterned sacrificial mask layer is formed in the first gate trench to expose a portion of the protection layer. After that, the exposed protection layer is removed, to form a U-shaped protection layer in the first gate trench. As following, a portion of the first work function layer under the exposed protection layer is removed, to form a U-shaped first work function layer in the first gate trench. Finally, the patterned sacrificial mask layer and the U-shaped protection layer are completely removed.

Through the present invention, a protection layer is further provided to cover the work function layer, with the protection layer having an etching selectively related to the work function layer and the sacrificial mask layer. Thus, the protection layer is capable of protecting the work function layer underneath during the etching back process, so as to effectively improve the work function performances, as well as the quality of the overall device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
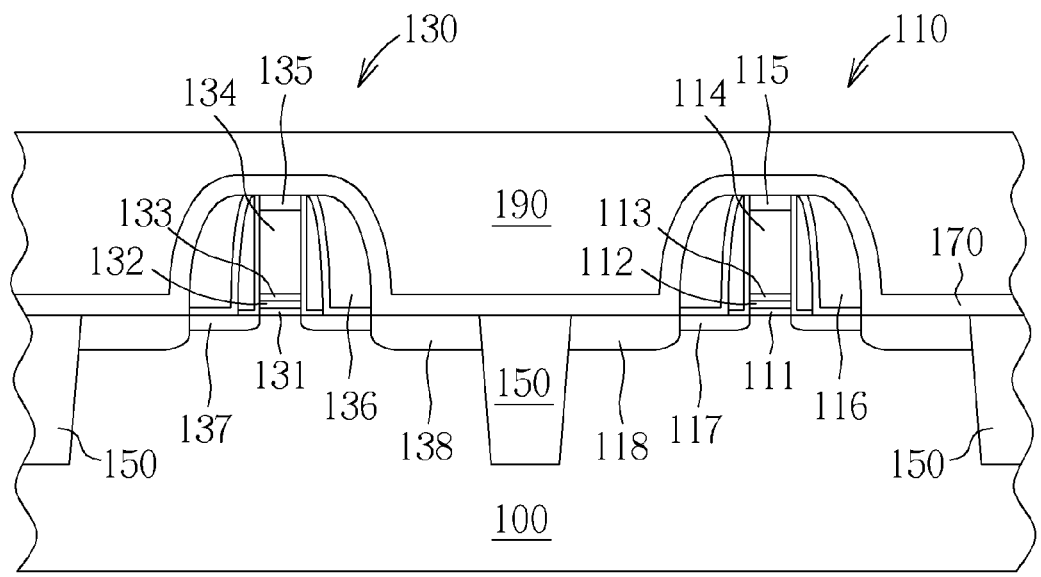
FIG. 1 to FIG. 10 are schematic diagrams illustrating a method of forming a semiconductor device having a metal gate according to a first preferred embodiment of the present invention.

Refer to FIG. 1 to FIG. 10. FIGS. 1-10 are schematic diagrams illustrating the method of fabricating a semiconductor device having a metal gate according to a first preferred embodiment of the present invention. First, as shown in FIG. 1, a substrate 100 is provided, such as a silicon substrate, a silicon-containing substrate or a silicon-on-insulator (SOI) substrate. A first transistor 110 and a second transistor 130 are formed on the substrate 100, wherein the first transistor 110 includes a first conductivity type, the second transistor 130 includes a second conductivity type, and the first conductivity type and the second conductivity type are complementary. A plurality of shallow trench isolations (STI) 150 is formed in the substrate 100 for providing electrical isolation, such that, the first transistor 110 and the second transistor 130 having the complementary conductivity types may be electrically isolated from each other by the STIs 150. Also, in one embodiment of the present invention, the first transistor 110 is a P-type transistor, while the second conductive type transistor 130 is an N-type transistor. However, those skilled in the art would easily realize that it is not limited to having the first conductivity type being the p-type and the second conductivity type being the n-type.

Precisely speaking, the first transistor 110 includes a first interlayer 111, a first high-k layer 112, a first etch stop layer 113, a first sacrificial gate 114, a first cap layer 115, a first spacer 116, a first lightly doped drain (LDD) 117 and a first source/drain 118. In one embodiment of the present invention, the first interlayer 111 may include $SiO_2$; the high-k gate dielectric layer 112 may include rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto; and the first etch stop layer 113 may include metal or metal nitride, such as TiN. In one embodiment, the first etch stop layer 113 can be omitted.

In a preferred embodiment, the first sacrificial gate 114 may be a poly-silicon gate. In another embodiment of the present invention, the first sacrificial gate may include amorphous silicon or a germanium, but not limited thereto. Furthermore, in another embodiment of the present invention, the first cap layer 115 for example may be a SiN layer; and the first spacer 116 may be a multi-layer structure including high temperature oxide (HTO), silicon nitride, silicon oxide or silicon nitride formed by hexachlorodisilane ($Si_2Cl_6$) (HCD-SiN), but not limited thereto.

The second transistor 130 may include a second interlayer 131, a second high-k layer 132, a second etch stop layer 133, a second sacrificial gate 134, a second cap layer 135, a second spacer 136, a second LDD 137 and a second source/drain 138. The components and material properties of the second transistor 130 of the present embodiment are similar to that of the first transistor 110, thus the second transistor 130 and the first transistor 110 may be formed simultaneously. However, in another embodiment, the second transistor 130 and the first transistor 110 may also be formed independently, but not limited thereto.

After forming the first transistor 110 and the second transistor 130, a contact etch stop layer (CESL) 170 and an inter-layer dielectric (ILD) layer 190 are formed sequentially on the substrate 100 to cover the first transistor 110 and the second transistor 130. In one embodiment, the CESL 170 may generate stress to forma selective strain scheme (SSS), thereby applying a compressing force to the first electrode 110 and a straining force to the second electrode 130, respectively.

Figure 2:
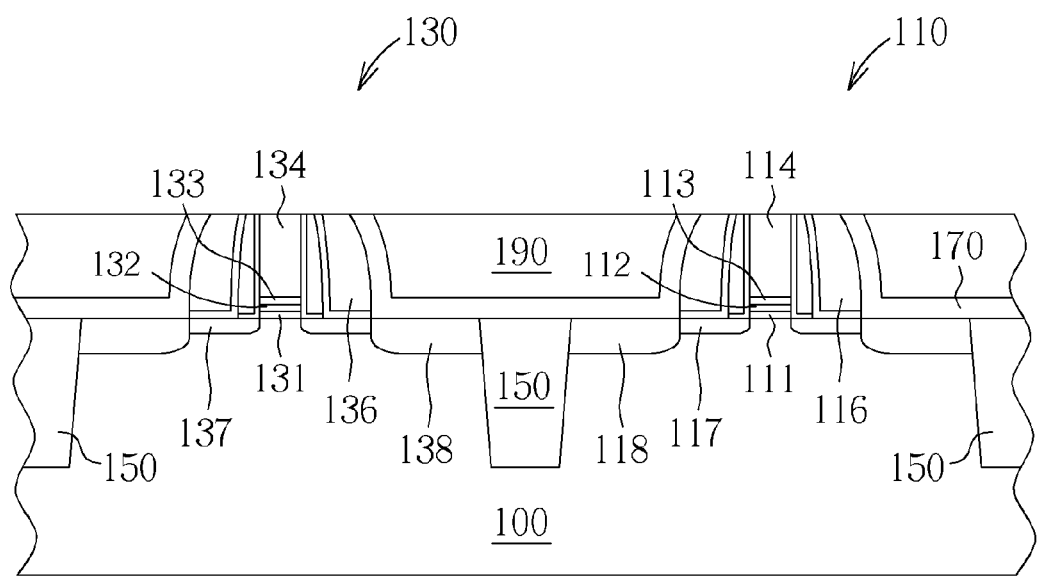

Next, as shown in FIG. 2, a planarization process, for example a chemical mechanical polishing/planarization (CMP) process, an etching process (i.e. an etching back process), or a CMP process following by an etching process, is optionally performed to remove a portion of the ILD layer 190. Please note that, in addition to partially removing the ILD layer 190, the CESL 170, the first spacer 116, the second spacer 136 are also partially removed and the first cap layer 115 and the second cap layer 135 are completely removed to at least expose top surfaces of the first sacrificial gate 114 and the second sacrificial gate 115 respectively.

Figure 3:
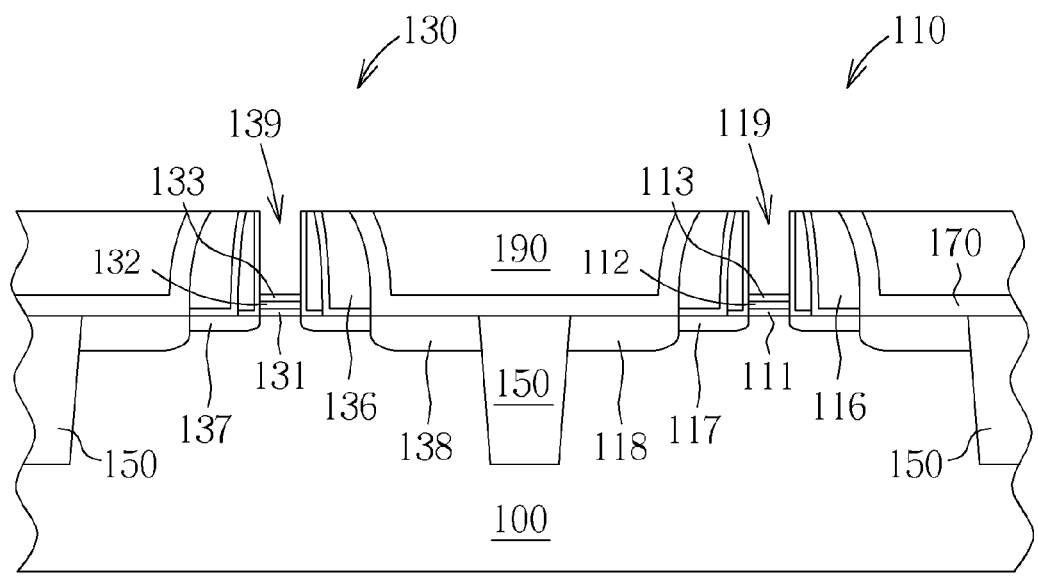

Then, as shown in FIG. 3, another etching process, for example a wet etching process and/or a dry etching process is performed to remove the first sacrificial gate 114 and the second sacrificial gate 134 until the first etch stop layer 113 and the second etch stop layer 133 are exposed. In other words, a first gate trench 119 and a second gate trench 139 are formed in the first transistor 110 and the second transistor 130 respectively. In a preferred embodiment of the present embodiment, the first etch stop layer 113 and the second etch stop layer 133 are removed after the first gate trench 119 and the second gate trench 139 are formed, but the present invention is not limited thereto.

Figure 4:
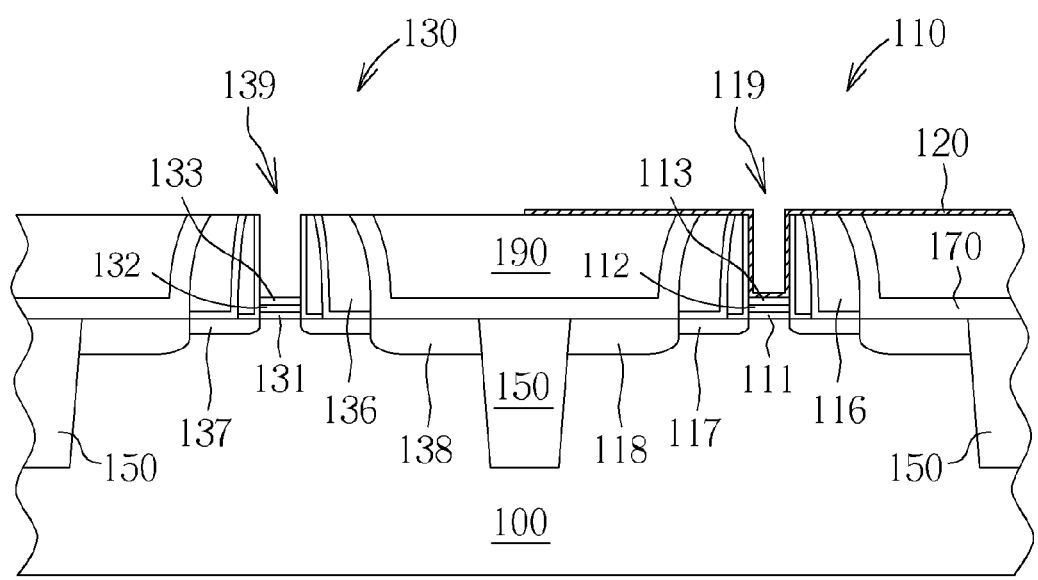

After that, as shown in FIG. 4, a first work function layer (not shown in the drawings) may be formed by firstly covering both in the first gate trench 119 and the second gate trench 139, and a patterned hard mask layer (not shown in the drawings) is provided on the ILD layer 190, to at least cover in the first gate trench 119, and then another etching process is performed by using the patterned hard mask layer as an etching mask, to remove a portion of the first work function layer covered in the second gate trench 139 and to form the patterned first work function layer 120 covering in the first gate trench 119, but not limited thereto. In the present embodiment, the first work function layer is preferably a P work function layer which may include WN, RuN, MoN, TiN, TaN, or WC, TaC, TiC, TiAlN, TaAlN, TiAlON or TiAlCN to serve as a work function metal in the first transistor 110. In a preferred embodiment, a bottom barrier layer (not shown in the drawings), for example a TiN layer, may be previously formed before the first work function layer is formed, but not limited thereto.

Figure 5:
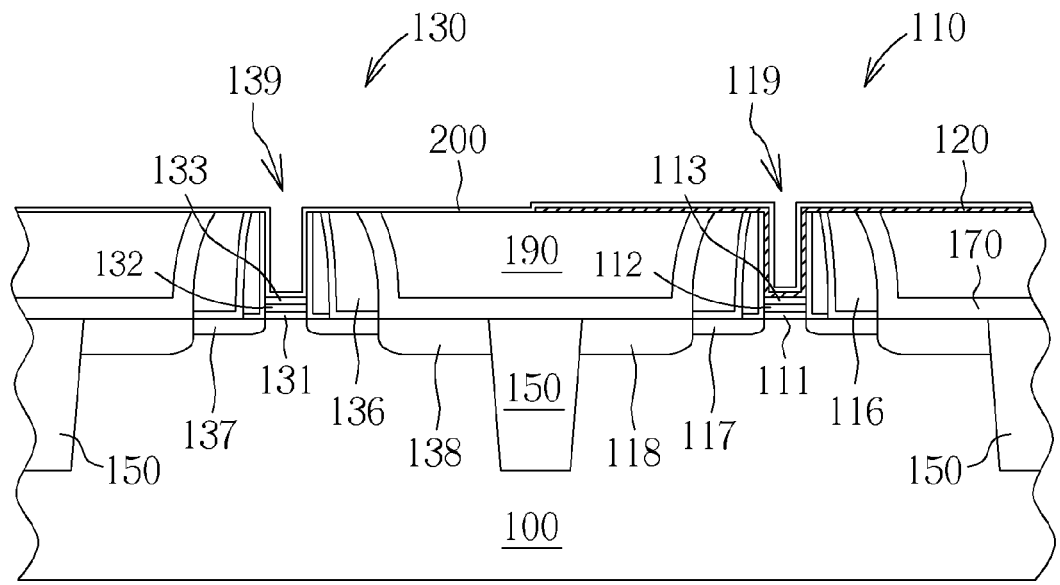

As following, as shown in FIG. 5, a protection layer 200 is formed on the substrate 100, to cover in the first gate trench 119 and the second gate trench 138. It is worth mentioning that the protection layer 200 at least completely covers the patterned first work function layer 120. In a preferred embodiment, the protection layer 200 may include a material having an etching selectivity related to the first work function layer 120, for example an oxide layer such as $SiO_2$, but not limited thereto.

Figure 6:
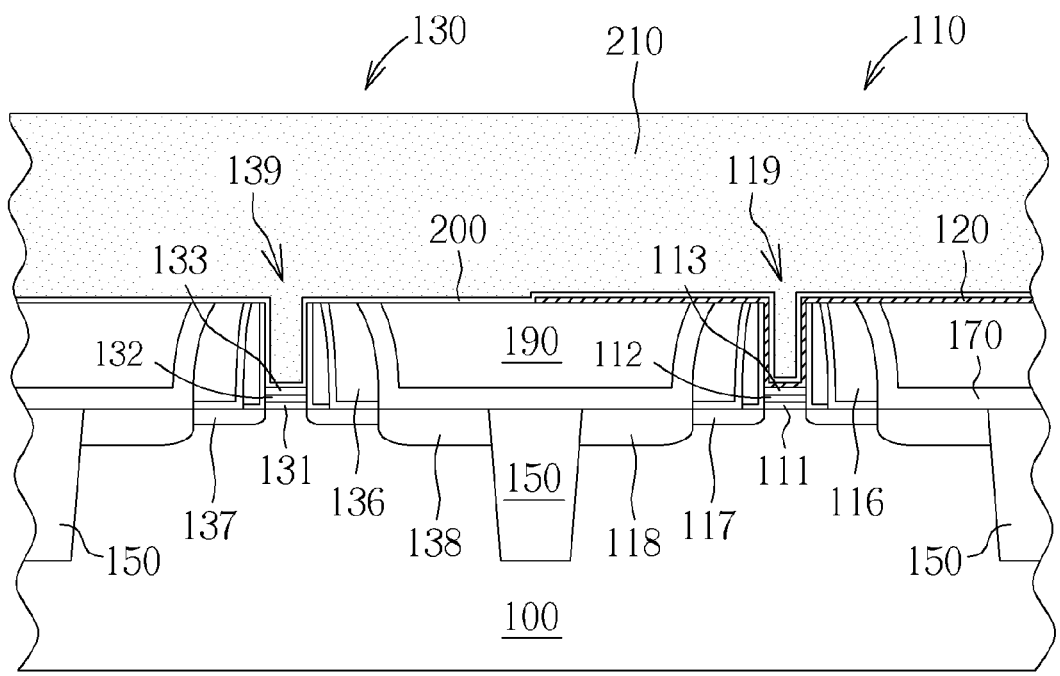

Next, as shown in FIG. 6, a sacrificial mask layer 210 is formed on the substrate 100, wherein the first gate trench 119 and the second gate trench 130 are completely filled with the sacrificial mask layer 210. The sacrificial mask layer 210 may include a material having superior gap-filling characteristic and an etching selectivity related to the protection layer 200, such as a bottom anti-reflective coating (BARC) layer, a polysilicon layer, a silicon-containing hard mask bottom anti-reflective coating (SHB) layer, a spin-on glass (SOG) layer, a sacrificial light absorbing material (SLAM) layer, or an oxygen-rich layer such as DUO (manufacturing by Honeywell Electronic Materials), but not limited thereto. In a preferred embodiment, the sacrificial mask layer 210 may include a monolayer structure shown in FIG. 6. However, in another embodiment of the present invention, the sacrificial mask layer may include a multilayer structure. Please note that, the protection layer 200 has an etching selectivity related to the sacrificial mask layer 210 and the first work function layer 120.

Figure 7:
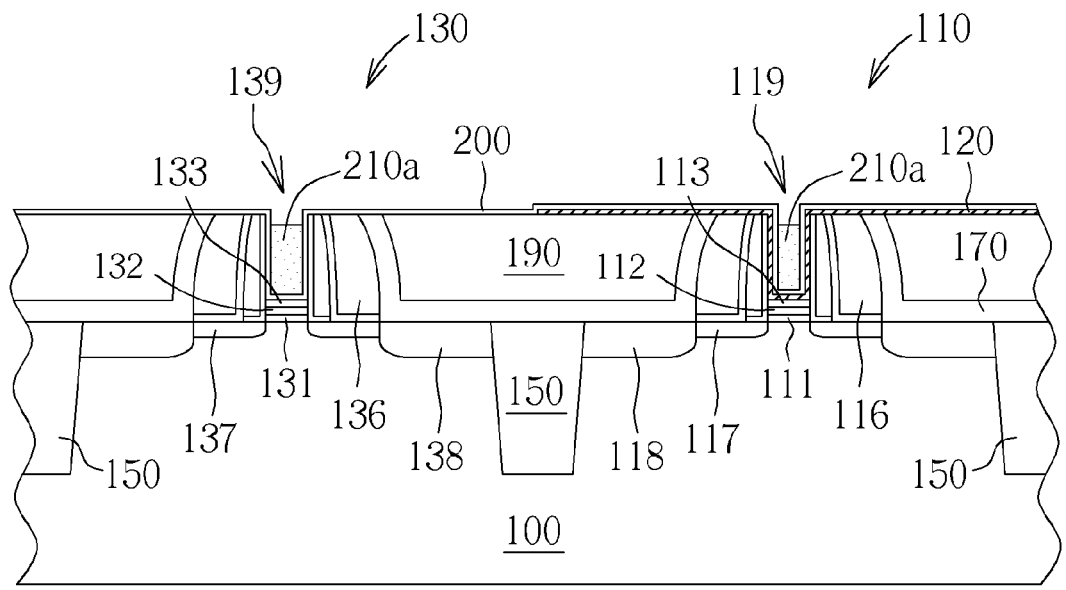

Then, as shown in FIG. 7, an etching back process is performed to remove a portion of the sacrificial mask layer 210 in the first gate trench 119 to not completely fill the first gate trench 119, and also to remove a portion of the sacrificial mask layer 210 in the second gate trench 139 to not completely fill the second gate trench 139, thereby forming the patterned sacrificial mask layer 210a. In other words, after the etching back process in this state, a top surface of the patterned sacrificial mask layer 210a is lower than the opening of the first gate trench 119, the opening of the second gate trench 130 and the ILD layer 190 to expose a portion of the protection layer 200. It is worth mentioning that, the protection layer 200 remains impervious to the etchant during the etching back process, due to the difference of the etching selectivity between the protection layer 200 and the sacrificial mask layer 210, such that the protection layer 200 protects the patterned first work function layer 120 underneath, especially to a portion of the patterned first work function layer 120 adjacent to the opening of the two gate trenches 119, 139, also known as the corner portion thereof.

Figure 8:
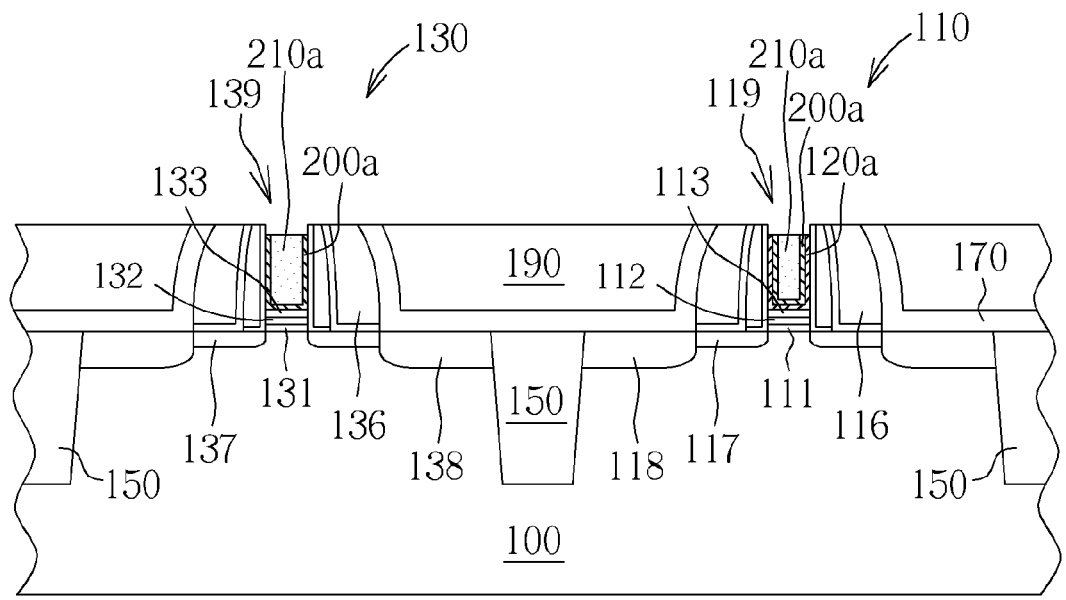

In the following, as shown in FIG. 8, the patterns of the patterned sacrificial mask layer 210a is then transferred to the protection layer 200 and the patterned first work function layer 120 by using the patterned sacrificial mask layer 210a shown in FIG. 8 as an etching mask, to form a U-shaped protection layer 200a both in the two gate trenches 119, 139 and a U-shaped first work function layer 120a in the first gate trenches 119.

Please note that, for overcoming the aforementioned difficulties caused by shrunken size, such as overhand structure and void issues, another etching back process is required to form the U-shaped first work function layer 120a. Due to the difference of the etching selectivity between the protection layer 200 and the patterned first work function layer 120, the patterned sacrificial mask layer 210a shown in FIG. 7 is firstly transferred to the protection layer 200, and then sequentially transferred to the patterned first work function layer 120. In other words, the U-shaped protection layer 200a and U-shaped first work function layer 120a are progressively formed in the first gate trench 119 through a two-steps-etching process. It is worth mentioning that, the protection layer 200 covered on the patterned first work function layer 120 well protects the patterned first work function layer 120, especially for the corner portion thereof, during the etching back process, such that it is sufficient to keep the patterned first work function layer 120 from being over-etched or incompletely etched. Therefore, with such protection providing by the protection layer 200, the work function performances, as well as the quality of the overall device can be improved.

Figure 9:
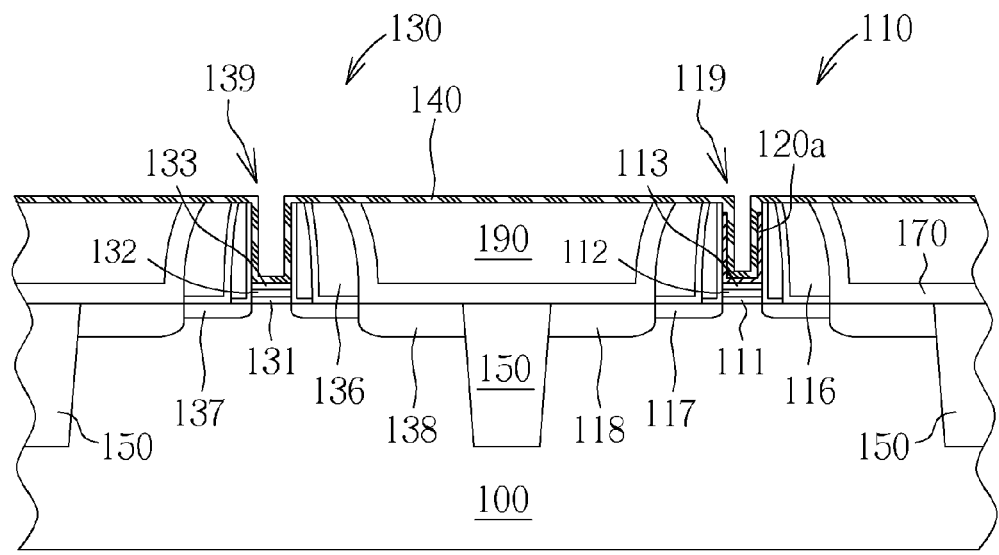

After that, as shown in FIG. 9, after the patterned sacrificial mask layer 210a and the protection layer 200a are completely removed from the two gate trenches 119, 139, a second work function layer 140, is formed on the substrate 100. Please also note that, as the patterned sacrificial mask layer 210a is removed firstly, the U-shaped protection layer 120a still protects the U-shaped first work function layer 120a, such that it is sufficient to completely remove the sacrificial mask layer usually remaining at the bottom of the gate trenches 119, 139.

The second work function layer 140 is formed on the surface of the ILD layer 190 and covers in the two gate trenches 119, 139 and the U-shaped first work function layer 120a in the first gate trench 119. In the present embodiment of the present invention, the second work function layer 140 is preferably an N work function layer which may include titanium aluminides (TiAl), aluminum zirconium (ZrAl), aluminum tungsten (WAl), aluminum tantalum (TaAl) or aluminum hafnium (HfAl), to serve as a work function metal in the second transistor 130. In a preferred embodiment, a top barrier layer (not shown in the drawings), for example a TiN layer, may be optionally formed after the second work function layer 140 is formed, but the present invention is not limited thereto.

Figure 10:
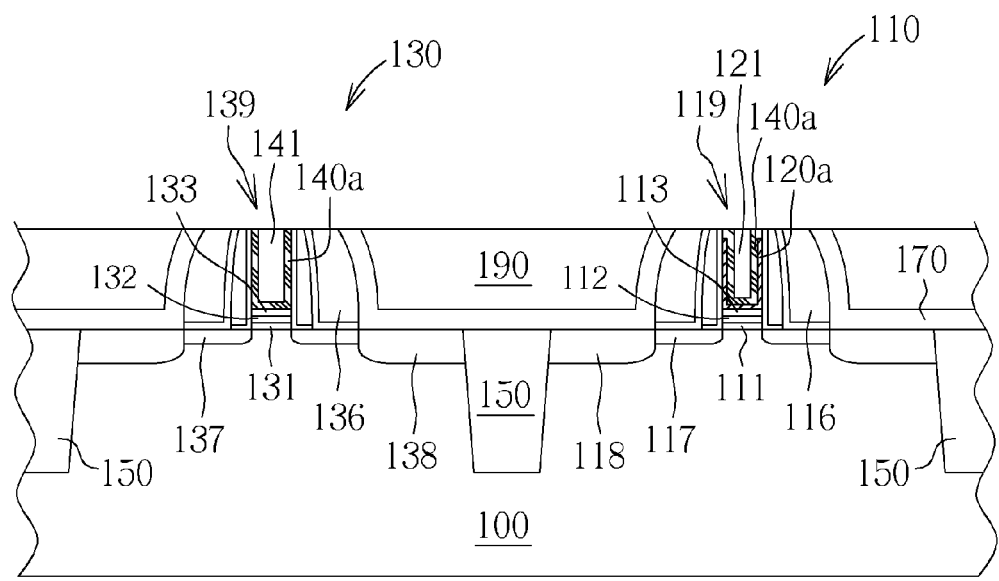

Finally, as shown in FIG. 10, metal gate layers 121, 141 are formed respectively, to completely fill the two gate trenches 119, 139. In a preferred embodiment, the metal gate layers 121, 141 may be formed by entirely forming a metal material layer (not shown in the drawings), such as a low resistive metal material layer, on the substrate 100 to completely fill the first gate trench 119 and the second gate trench 139, and then performing a planarization process to simultaneously remove the metal material layer and the second work function layer 140 outside of the first gate trench 119 and the second gate trench 139, to form the metal gate layers 121, 141 and the patterned second work function layer 140a. In addition, the metal gate layer 121, 141 may include Al, Ti, Ta, W, Nb, Mo, TiN, TiC, TaN, Ti/W or Ti/TiN, but is not limited thereto.

Thus, the first etch stop layer 113 (optional), the U-shaped first work function layer 120a, the patterned second work function layer 140a and the metal gate layer 121 in the first gate trench 119 together form a first metal gate structure of the first transistor 110 (P-type transistor). Also, the second etch stop layer 133 (optional), the patterned second work function layer 140a and the metal gate layer 141 in the second gate trench 139 together form a second metal gate structure of the second transistor 130 (N-type transistor).

The following description will detail the different embodiments of the method of forming a semiconductor device having a metal gate of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
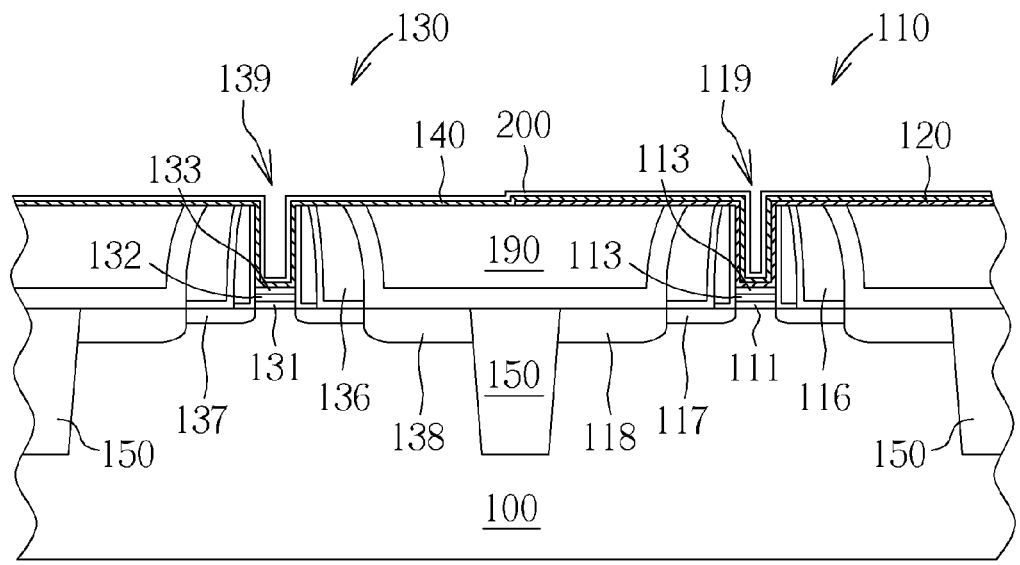
FIG. 11 to FIG. 14 are schematic diagrams illustrating a method of forming a semiconductor device having a metal gate according to a second preferred embodiment of the present invention.

Referring to FIGS. 11-14, FIGS. 11-14 are schematic diagrams illustrating a method of forming a semiconductor device having a metal gate according to a second preferred embodiment of the present invention. In comparison with the aforementioned first preferred embodiment, the second work function layer 140 may also be formed before the protection layer 120 is formed, namely, formed between the patterned first work function layer 120 and the protection layer 200, as shown in FIG. 11. It is noted that, the second work function layer 140 has an etching selectivity related to the protection layer 200.

Figure 12:
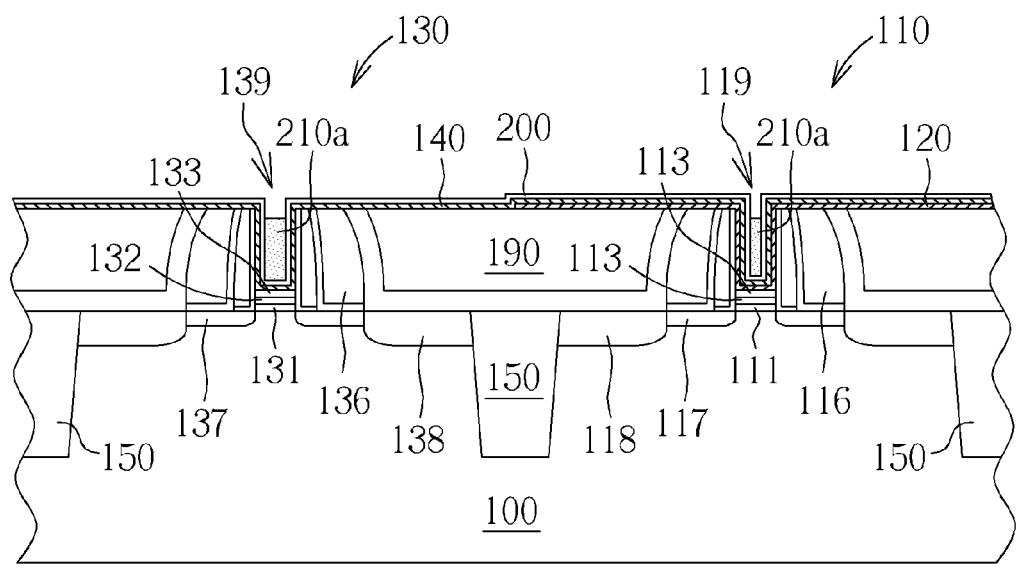

Then, as shown in FIG. 12, similar to the aforementioned preferred embodiment, the patterned sacrificial mask layer 210a is formed in the first gate trench 119 and the second gate trench 139 simultaneously. It is worth further mentioning that, the protection layer 200 remains impervious to the etchant during patterning the patterned sacrificial mask layer 210, due to the difference of the etching selectivity between the protection layer 200 and the sacrificial mask layer 210, such that the protection layer 200 protects the second work function layer 140 underneath, especially to a portion of the second work function layer 140 adjacent to the opening of the two gate trenches 119, 139, also known as the corner portion thereof.

Figure 13:
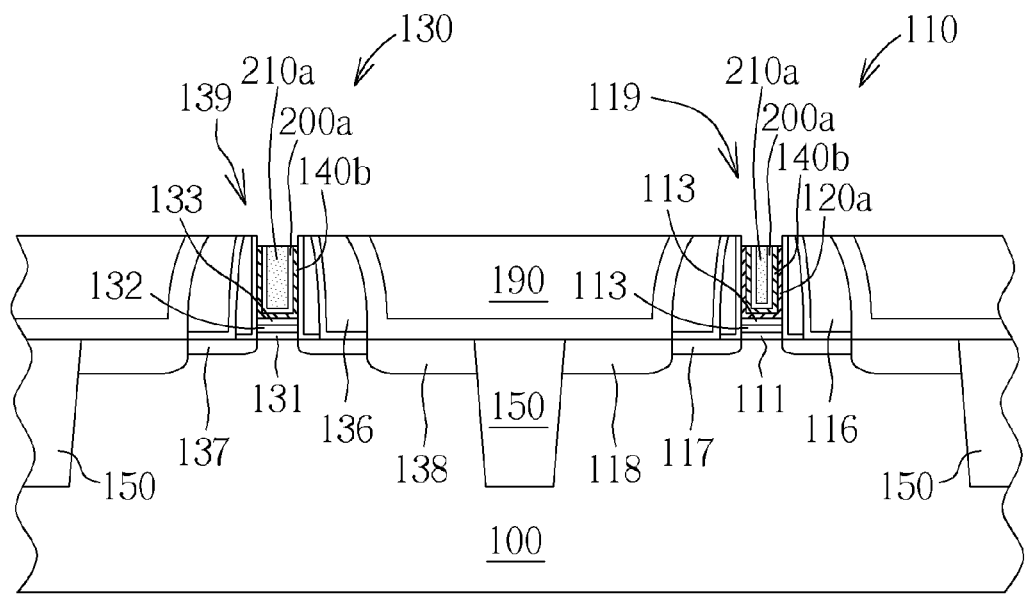
Figure 14:
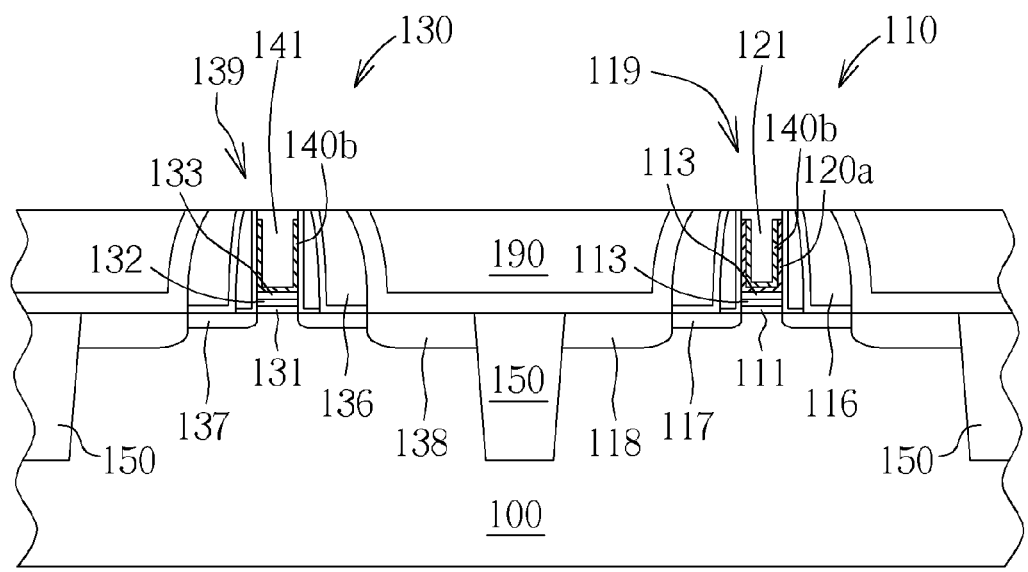

As following, the patterns of the patterned sacrificial mask layer 210a are then transferred to the protection layer 200, the second work function layer 140 and the first work function layer 120 by using the patterned sacrificial mask layer 210a shown in FIG. 12 as an etching mask, to form the U-shaped protection layer 200a, a U-shaped second work function layer 140b and the U-shaped first work function layer 120a in the first gate trenches 119, and to form the U-shaped protection layer 200a, a U-shaped second work function layer 140b in the second gate trenches 139, as shown in FIG. 13.

Finally, after the patterned sacrificial mask layer 210a and the U-shaped protection layer 200a are completely removed from the two gate trenches 119, 139, the metal gate layers 121, 141 are formed in the two gate trenches 119, 139 respectively. Thus, in the present embodiment, the first etch stop layer 113 (optional), the U-shaped first work function layer 120a, the U-shaped second work function layer 140b and the metal gate layer 121 in the first gate trench 119 together form the first metal gate structure of the first transistor 110 (P-type transistor). Also, the second etch stop layer 133 (optional), the U-shaped second work function layer 140b and the metal gate layer 141 in the second gate trench 139 together form the second metal gate structure of the second transistor 130 (N-type transistor).

It should be noted that the above method shown in a gate-last process can also be applied in a gate-first process. Besides, the above methods present forming the high-k gate dielectric layer in a first step (namely, the high-K first process). However, those skilled in the art can realize that, in the present invention, it is also possible to form another high-k layer after removing the sacrificial gate (namely, the high-K last process). In another embodiment, the first transistor 110 and the second transistor 130 can be non-planar transistors such as FinFET and those in the art may easily realize the present invention is not limited to the planar transistor application shown above.

It is noted that, the method of present invention further provides a protection layer covering the patterned P work function layer, with the protection layer having an etching selectively related to the P work function layer and the sacrificial mask layer. With such performance, the protection layer is capable of protecting the P work function layer underneath during the etching back process. Thus, the method of the present invention may effectively avoid the defects either caused by the over-etching or incomplete etching the material layer, so as to effectively improve the work function performances, as well as the quality of the overall device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device having a metal gate, comprising:
   forming a first gate trench and a second gate trench in a dielectric layer;
   forming a first work function layer, covering in the first gate trench;
   forming a second work function layer, covering in the second gate trench and the first work function layer in the first gate trench;
   forming a protection layer in the first gate trench and the second gate trench;
   forming a patterned sacrificial mask layer in the first gate trench and the second gate trench to expose a portion of the protection layer;
   removing the exposed portion of the protection layer, to form a U-shaped protection layer in the first gate trench and another U-shaped protection layer in the second gate trench;
   removing a portion of the first work function layer and a portion of the second work function layer under the exposed portion of the protection layer, to form a U-shaped first work function layer in the first gate trench and a U-shaped second work function layer in the second gate trench; and
   completely removing the patterned sacrificial mask layer and the U-shaped protection layers.

2. The method of forming the semiconductor device having the metal gate according to claim 1, wherein the forming of the patterned sacrificial mask layer further comprises:
   filling up the first gate trench with a sacrificial mask layer, and removing a portion of the sacrificial mask layer to not completely fill the first gate trench and to form the patterned sacrificial mask layer.

3. The method of forming the semiconductor device having the metal gate according to claim 1, wherein the protection layer has an etching selectivity related to the first work function layer.

4. The method of forming the semiconductor device having the metal gate according to claim 3, wherein the first work function layer comprises WN, RuN, MoN, TiN, TaN, or WC, TaC, TiC, TiAlN, TaAlN, TiAlON or TiAlCN.

5. The method of forming the semiconductor device having the metal gate according to claim 1, wherein the protection layer comprises an oxide layer.

6. The method of forming the semiconductor device having the metal gate according to claim 1, wherein the protection layer has an etching selectivity related to the patterned sacrificial mask layer.

7. The method of forming the semiconductor device having the metal gate according to claim 6, wherein the patterned sacrificial mask layer comprises a bottom anti-reflective coating (BARC) layer, a polysilicon layer, a silicon-containing hard mask bottom anti-reflective coating (SHB) layer, a spin-on glass (SOG) layer, a sacrificial light absorbing material (SLAM) layer or an oxygen-rich layer.

8. The method of forming the semiconductor device having the metal gate according to claim 1, wherein before the forming of the first work function layer, further comprises forming a first high-k dielectric layer, covering in the first gate trench.

9. The method of forming the semiconductor device having the metal gate according to claim 1, wherein before the forming of the first work function layer, further comprises forming a second high-k dielectric layer, covering in the second gate trench.

10. The method of forming the semiconductor device having the metal gate according to claim 1, wherein the second work function layer is formed before the protection layer is formed.

11. A method of forming the semiconductor device having the metal gate, comprising:
    forming a first gate trench and a second gate trench in a dielectric layer;
    forming a first work function layer, covering in the first gate trench;
    forming a protection layer in the first gate trench, on the first work function layer, and in the second gate trench;
    forming a patterned sacrificial mask layer in the first gate trench to expose a portion of the protection layer;
    removing the exposed protection layer, to form a U-shaped protection layer in the first gate trench;
    removing a portion of the first work function layer under the exposed protection layer, to form a U-shaped first work function layer in the first gate trench;
    completely removing the patterned sacrificial mask layer and the U-shaped protection layer; and
    after completely removing the U-shaped protection layer, forming a second work function layer in the second gate trench and in the first gate trench, on the first work function layer.

* * * * *